(12) United States Patent
Seagle

(10) Patent No.: US 7,582,218 B2
(45) Date of Patent: *Sep. 1, 2009

(54) METHOD FOR MERGING SENSOR FIELD-MILL AND ELECTRONIC LAPPING GUIDE MATERIAL PLACEMENT FOR A PARTIAL MILL PROCESS AND SENSOR FORMED ACCORDING TO THE METHOD

(75) Inventor: David John Seagle, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 416 days.

This patent is subject to a terminal disclaimer.

(21) Appl. No.: 11/396,981

(22) Filed: Apr. 3, 2006

(65) Prior Publication Data

US 2007/0230063 A1 Oct. 4, 2007

(51) Int. Cl.
*G11B 5/39* (2006.01)
(52) U.S. Cl. .............................. 216/22; 216/38; 216/41; 216/49; 216/88; 216/89
(58) Field of Classification Search .................. 216/22
See application file for complete search history.

(56) References Cited

U.S. PATENT DOCUMENTS

| 6,193,584 | B1 * | 2/2001 | Rudy et al. ..................... 451/5 |
| 6,496,334 | B1 * | 12/2002 | Pang et al. ................... 360/319 |
| 6,515,475 | B2 * | 2/2003 | Goubau et al. .............. 324/210 |
| 6,609,948 | B1 * | 8/2003 | Fontana et al. ................. 451/5 |
| 7,287,316 | B2 * | 10/2007 | Kasahara et al. .............. 29/737 |
| 2003/0020467 | A1 | 1/2003 | Kasahara et al. |
| 2004/0179307 | A1 * | 9/2004 | Burbank et al. ............. 360/313 |
| 2005/0185345 | A1 | 8/2005 | Ding et al. |

* cited by examiner

*Primary Examiner*—Anita K Alanko
(74) *Attorney, Agent, or Firm*—Merchant & Gould

(57) ABSTRACT

A method for merging sensor field-mill and electronic lapping guide material placement for a partial mill process and sensor formed according to the method is disclosed. An electronic lapping guide is formed coplanar with a sensor. The coplanar electronic lapping guide and sensor are processed to provide the electronic lapping guide and sensor with predetermined dimensions. The merging of the sensor field-mill and placement of the electronic lapping guide material for partial mill CPP eliminates steps and therefore the cycle time. Moreover, the electronic lapping guide region is raised to the height of the sensor plane to allow the sensor and electronic lapping guide to be defined in the same focal plane of the optics.

8 Claims, 21 Drawing Sheets

METHOD FOR MERGING SENSOR FIELD-MILL AND ELECTRONIC LAPPING GUIDE MATERIAL PLACEMENT FOR A PARTIAL MILL PROCESS AND SENSOR FORMED ACCORDING TO THE METHOD

FIELD OF THE INVENTION

This disclosure relates in general to a method for making an electronic lapping guide in a partial mill process, and more particularly to a method for merging sensor field-mill and electronic lapping guide material placement for a partial mill process and sensor formed according to the method.

BACKGROUND

A typical magnetoresistive (MR) read head includes an MR read sensor, which is located between first and second shield layers. The first and second shield layers act as leads for the sensor. Thus, the lead/shield layers are connected to the read sensor for conducting a sense current therethrough. When the read sensor is subjected to positive and negative signal fields from tracks on a rotating magnetic disk in a disk drive the resistance of the read sensor changes. These resistance changes cause potential changes in the sense current circuit, which are processed as playback signals by processing circuitry.

The read head has an exterior head surface that faces the rotating magnetic disk and is supported on swirling air from the rotating disk, which is referred to as an air bearing. For this reason the head surface is referred to as an air bearing surface (ABS).

The read sensor has a back edge that is recessed in the read head opposite the air bearing surface. The back edge is precisely located by photolithography processing. During construction the ABS must also be precisely defined so that the read sensor has a precise stripe height, which is the distance between the ABS and the back edge. This is accomplished by lapping (grinding) a wafer on which the MR head is constructed until the ABS is achieved.

The stripe height of MR sensor is determined by lapping the head structure while measuring the resistance of an electrical element. This electrical element is called an electronic lapping guide (ELG). The back edge of the ELG is formed in the same photo and subtractive processes as the back edge of the sensor element, i.e. the ELG back edge and the sensor back edge are self-referenced to each other.

One problem with the present ELG strategy occurs when smaller sensor heights are required. For proper lapping to the target stripe height, a final predetermined ELG resistance based on the sheet resistance of the material is required. As the target stripe heights decrease, the final ELG resistance is made greater. This increase in final resistance will invariably require modification of lapping algorithms and electronics to sense the higher resistance. Although the geometry of the lapping guide can be changed to reduce the final resistance, i.e. decrease the ELG length or offset the back edge of the ELG relative to the sensor element, the lapping precision is degraded since the rate of resistance change versus ELG height is also reduced by these changes.

A second problem associated with electronic lapping guides occurs when new sensor materials with higher magnetoresistance, DR/R characteristics are used. When the ELG is formed using this sensor material, the sheet resistance, $R_s$, of the ELG material can vary depending on the orientation of the magnetization of the free and pinned layers. These orientations can be perturbed by external fields or by stress induced by the lapping process. Such an $R_s$ change can affect final stripe height independent of the lapping algorithm precision.

A third problem associated with electronic lapping guides occurs when "current perpendicular to the plane" (CPP) structures are used, such as tunnel valve sensors. The sheet resistance of such structures as measured across the planes is typically low, thereby making the resistance of the ELG too low for accurate measurements of resistance changes during lapping. This reduces final ELG resistances to values on the order of 2 to 4 ohms. This is particularly so for tunnel valve structures where the sensor consists of capping layers composed of noble metals (e.g., Pt, Pd, Rh, Au, Cu).

A so-called mill-refill process has been used to replace the sensor material with other thin-film materials in order to tailor the resistivity of the electronic lapping guide. The mill-refill process requires that the electronic lapping guide material have a maximum "effective milling thickness" that is completely milled when the sensor is completely milled.

In order to make high areal density heads, partially milled sensor structures have been considered. A partially milled sensor structures involves defining the stripe-height by partially milling the sensor. To produce a partial mill structure, electronic lapping guide material must be created independently of the sensor material. The purpose is to not only tailoring the resistance, but also to assure that the edges of the electronic lapping guide are completely milled at the termination of the sensor's partial mill. However, using tunneling magnetoresistance (TMR) materials for electronic lapping guides would guarantee that the electronic lapping guides are shorted for a partial mill.

Two actions are required to implement the partial mill process. First, the material in the ELG region that will fully mill when the element is only partially milled must be placed. Next, the sensor must be cleared in the field in a step independent of that which performs the sensor mill.

Two separate photolithography steps during the partial mill have been used to meet the two requirements indicated above. First, the sensor is deposited full film. Then, the sensor film around just the electronic lapping guide is milled and replaced with a predetermined electronic lapping guide material. The sensor film in the field is milled and replaced with alumina. The back edge of the strip is then defined with a partial mill simultaneously with the back edge of the electronic lapping guide.

If the number of manufacturing steps could be reduced, the cycle time and cost of manufacturing the sensor could be reduced. In addition, using the above process results in the electronic lapping guide not being in the same focal plane as the element, thereby making the electronic lapping guide edge to sensor-edge sensitive to variations in focus.

It can be seen that there is a need for a method for merging sensor field-mill and electronic lapping guide material placement for a partial mill process and sensor formed according to the method.

SUMMARY OF THE INVENTION

To overcome the limitations in the prior art described above, and to overcome other limitations that will become apparent upon reading and understanding the present specification, the present invention discloses a method for merging sensor field-mill and electronic lapping guide material placement for a partial mill process and sensor formed according to the method.

The present invention solves the above-described problems by merging of the sensor field-mill and placement of the electronic lapping guide material for partial mill CPP to eliminates steps and therefore the cycle time. Moreover, the electronic lapping guide region is raised to the height of the sensor plane to allow the sensor and electronic lapping guide to be defined in the same focal plane of the optics.

A method for merging sensor field-mill and electronic lapping guide material placement for a partial mill process in accordance with the principles of the present invention includes forming an electronic lapping guide coplanar with a sensor and processing the coplanar electronic lapping guide and sensor to provide the electronic lapping guide and sensor with predetermined dimensions.

In another embodiment of the present invention, another method for merging sensor field-mill and electronic lapping guide material placement for a partial mill process is provided. This method includes forming a full film sensor over a shield and shield refill material, milling the sensor on a first side and a second side, depositing sensor refill material on the first and second sides of the sensor, depositing an electronic lapping guide material over the sensor refill material until the electronic lapping guide material is substantially coplanar with the sensor, depositing photoresist over the sensor and the electronic lapping guide material, milling the sensor and the electronic lapping guide material using the photoresist as a mask, depositing a mill refill material and removing the photoresist to provide a electronic lapping guide coplanar with the sensor.

In another embodiment of the present invention, a sensor and electronic lapping guide structure is provided. The sensor and electronic lapping guide structure includes a sensor formed over a shield and shield refill material and an electronic lapping guide formed coplanar with the sensor.

In another embodiment of the present invention, a storage device is provided. The storage device includes a moveable magnetic storage medium for storing data thereon, a slider that has a transducer made of write and read heads, a suspension arm above the rotating magnetic disk, an actuator arm that swings the suspension arm to place the transducer over selected areas of the magnetic storage medium and a magnetoresistive sensor, coupled to the actuator, for reading data from the magnetic recording medium when position to a desired location by the actuator, wherein the magnetoresistive sensor further comprises a sensor formed over a shield and shield refill material and an electronic lapping guide formed coplanar with the sensor.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the embodiments, reference is made to the accompanying drawings that form a part hereof, and in which is shown by way of illustration the specific embodiments in which the invention may be practiced. It is to be understood that other embodiments may be utilized because structural changes may be made without departing from the scope of the present invention.

The present invention provides a method for merging sensor field-mill and electronic lapping guide material placement for a partial mill process and sensor formed according to the method. The merging of the sensor field-mill and placement of the electronic lapping guide material for partial mill CPP eliminates steps and therefore the cycle time. Moreover, the electronic lapping guide region is raised to the height of the sensor plane to allow the sensor and electronic lapping guide to be defined in the same focal plane of the optics.

Figure 1:
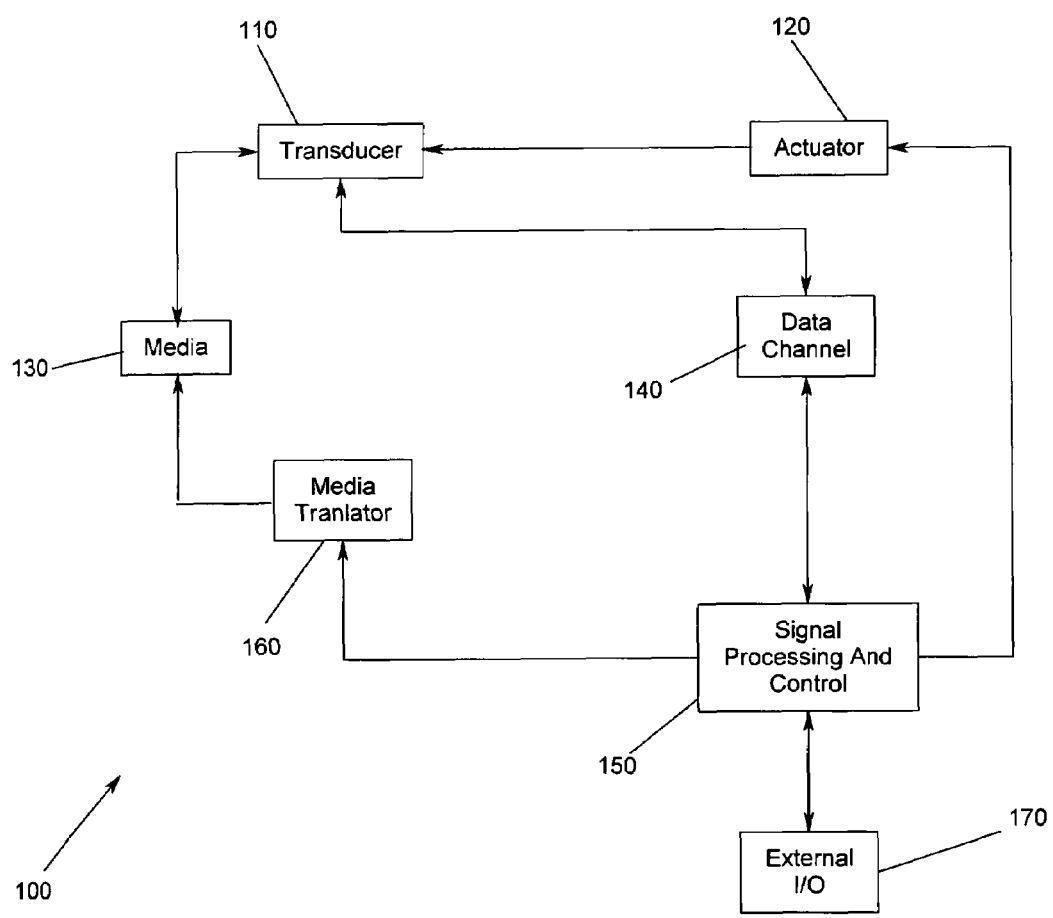
FIG. 1 illustrates a storage system according to an embodiment of the present invention.

FIG. 1 illustrates an exemplary storage system 100 according to the present invention. A transducer 110 is under control of an actuator 120, whereby the actuator 120 controls the position of the transducer 110. The transducer 110 writes and reads data on magnetic media 130. The read/write signals are passed to a data channel 140. A signal processor 150 controls the actuator 120 and processes the signals of the data channel 140 for data exchange with external Input/Output (I/O) 170. I/O 170 may provide, for example, data and control conduits for a desktop computing application, which utilizes storage system 100. In addition, a media translator 160 is controlled by the signal processor 150 to cause the magnetic media 130 to move relative to the transducer 110. The present invention is not meant to be limited to a particular type of storage system 100 or to the type of media 130 used in the storage system 100.

Figure 2:
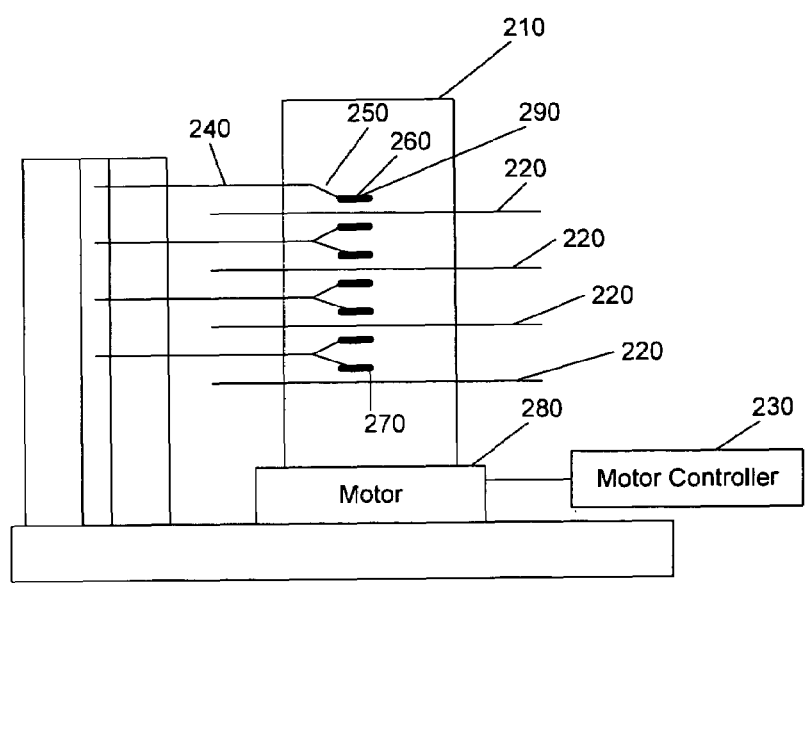
FIG. 2 illustrates one storage system according to an embodiment of the present invention.

FIG. 2 illustrates one particular embodiment of a multiple magnetic disk storage system 200 according to the present invention. In FIG. 2, a hard disk drive storage system 200 is shown. The system 200 includes a spindle 210 that supports and rotates multiple magnetic disks 220. The spindle 210 is rotated by motor 280 that is controlled by motor controller 230. A combined read and write magnetic head 270 is mounted on slider 260 that is supported by suspension 250 and actuator arm 240. Processing circuitry exchanges signals that represent information with read/write magnetic head 270, provides motor drive signals for rotating the magnetic disks 220, and provides control signals for moving the slider 260 to various tracks. Although a multiple magnetic disk storage system is illustrated, a single magnetic disk storage system is equally viable in accordance with the present invention.

The suspension 250 and actuator arm 240 position the slider 260 so that read/write magnetic head 270 is in a transducing relationship with a surface of magnetic disk 220. When the magnetic disk 220 is rotated by motor 280, the slider 260 is supported on a thin cushion of air (air bearing) between the surface of disk 220 and the ABS 290. Read/write magnetic head 270 may then be employed for writing information to multiple circular tracks on the surface of magnetic disk 220, as well as for reading information therefrom.

Figure 3:
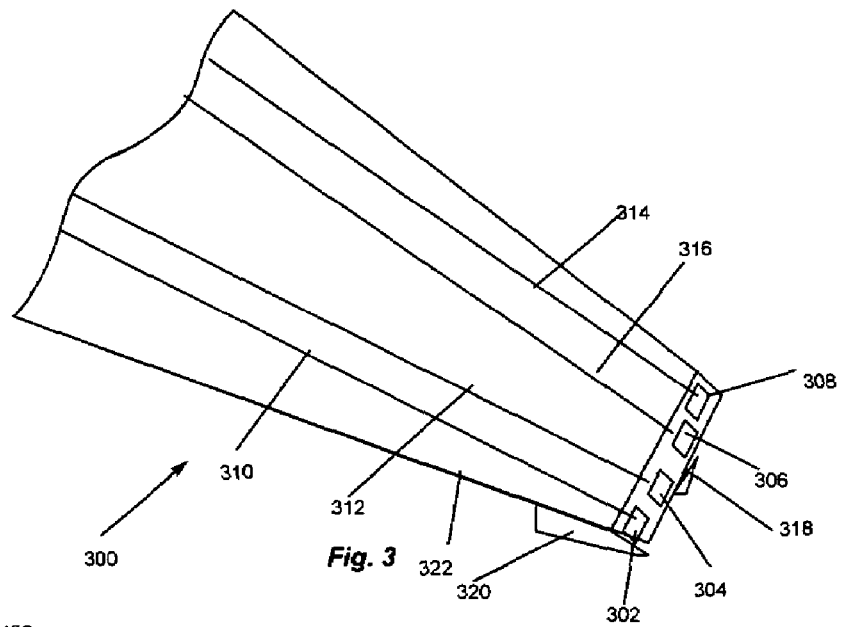
FIG. 3 illustrates a slider mounted on a suspension according to an embodiment of the present invention.

FIG. 3 illustrates a sensor assembly 300. In FIG. 3, a slider 320 is mounted on a suspension 322. First and second solder connections 302 and 308 connect leads from the sensor 318 to leads 310 and 314, respectively, on suspension 322 and third and fourth solder connections 304 and 306 connect to the write coil (not shown) to leads 312 and 316, respectively, on suspension 322.

Figure 4:
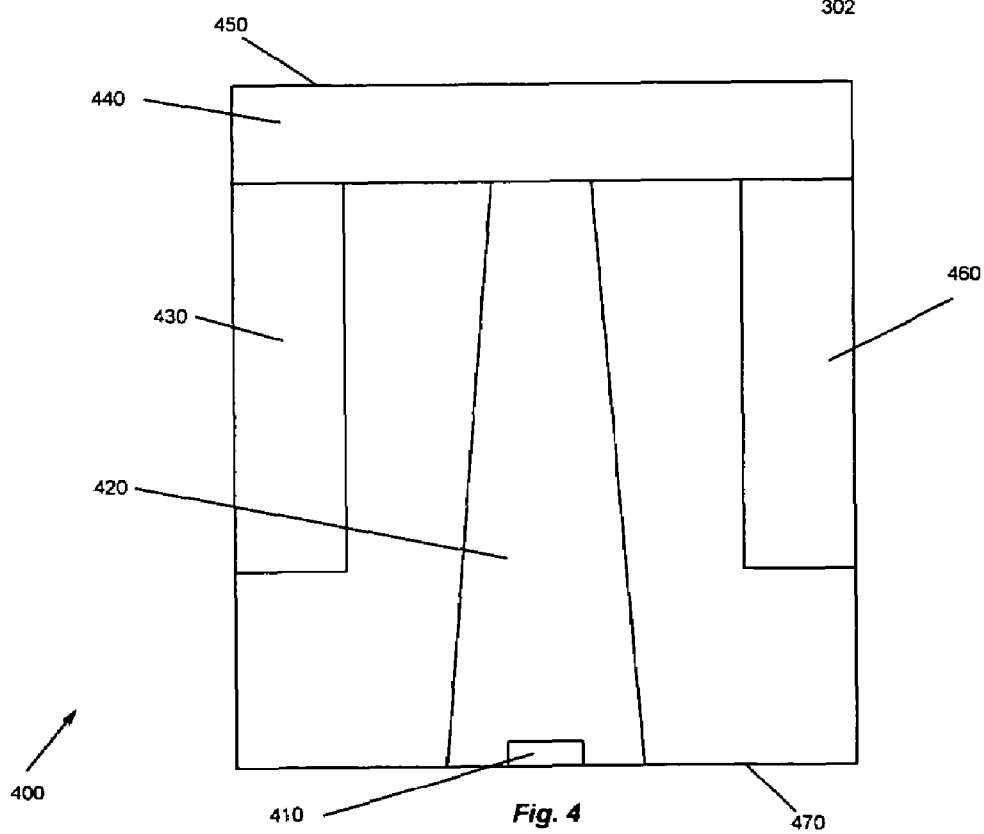
FIG. 4 illustrates an ABS view of the slider and the magnetic head according to an embodiment of the present invention.

FIG. 4 is an ABS view of slider 400 and magnetic head 410. The slider has a center rail 420 that supports the magnetic head 410, and side rails 430 and 460. The support rails 420, 430 and 460 extend from a cross rail 440. With respect to rotation of a magnetic disk, the cross rail 440 is at a leading edge 450 of slider 400 and the magnetic head 410 is at a trailing edge 470 of slider 400.

The above description of a typical magnetic recording disk drive system, shown in the accompanying FIGS. 1-4, is for presentation purposes only. Storage systems may contain a large number of recording media and actuators, and each actuator may support a number of sliders. In addition, instead of an air-bearing slider, the head carrier may be one that maintains the head in contact or near contact with the disk, such as in liquid bearing and other contact and near-contact recording disk drives.

Figure 5:
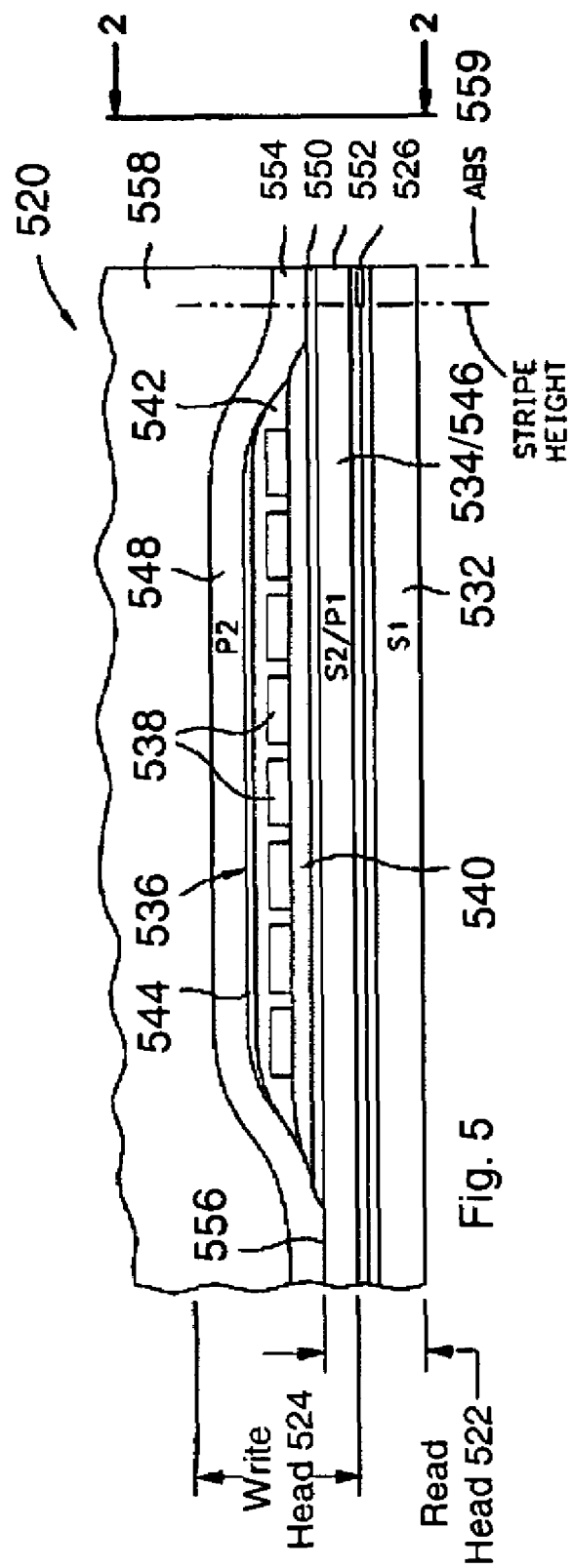
FIG. 5 is a cross-sectional side view of a magnetic head assembly, which includes a read head and a write head.

FIG. 5 illustrates a head assembly 520. The head assembly 520 includes a read head portion 522 and a write head portion 524. The read head portion includes a magnetoresistive (MR) read sensor 526 located between ferromagnetic first and second shield layers (S1) and (S2) 532 and 534. The write head includes an insulation stack 536, which has a write coil 538 that is located between first and second nonmagnetic insulative layers 540 and 542. The insulation may further have a third nonmagnetic insulation layer 544 on top of the insulation layer 542 for smoothing out ripples of the second insulation layer. The insulation stack 536 is located between ferromagnetic first and second pole piece layers (P1) and (P2) 546 and 548. A write gap layer 550 is located between first and second pole tip portions 552 and 554 of the first and second pole piece layers and the first and second pole piece layers are connected at a back gap 556. An overcoat layer 558 is on top of the magnetic head assembly. This type of magnetic head assembly is known in the art as a merged MR head since the second shield layer 534 and the first pole piece layer 546 are a common layer. Another type of magnetic head assembly employs separate layers for the first shield layer and the first pole piece layer with an isolation insulative layer therebetween. This latter head is known in the art as a piggyback head. In either type of head assembly the head assembly, as well as the wafer upon which it is constructed, must be lapped to an air bearing surface (ABS) 559, as shown in FIG. 5. This establishes a stripe height for the read sensor 526, which is also shown in FIG. 5. The lapping of a row of head assemblies from the wafer must be precise in order to establish a proper stripe height for each read sensor. When the stripe height is not precisely defined, the resistance of the read sensor to a current conducted therethrough is different from the designed resistance, which will impact the accuracy of playback signals.

Figure 6:
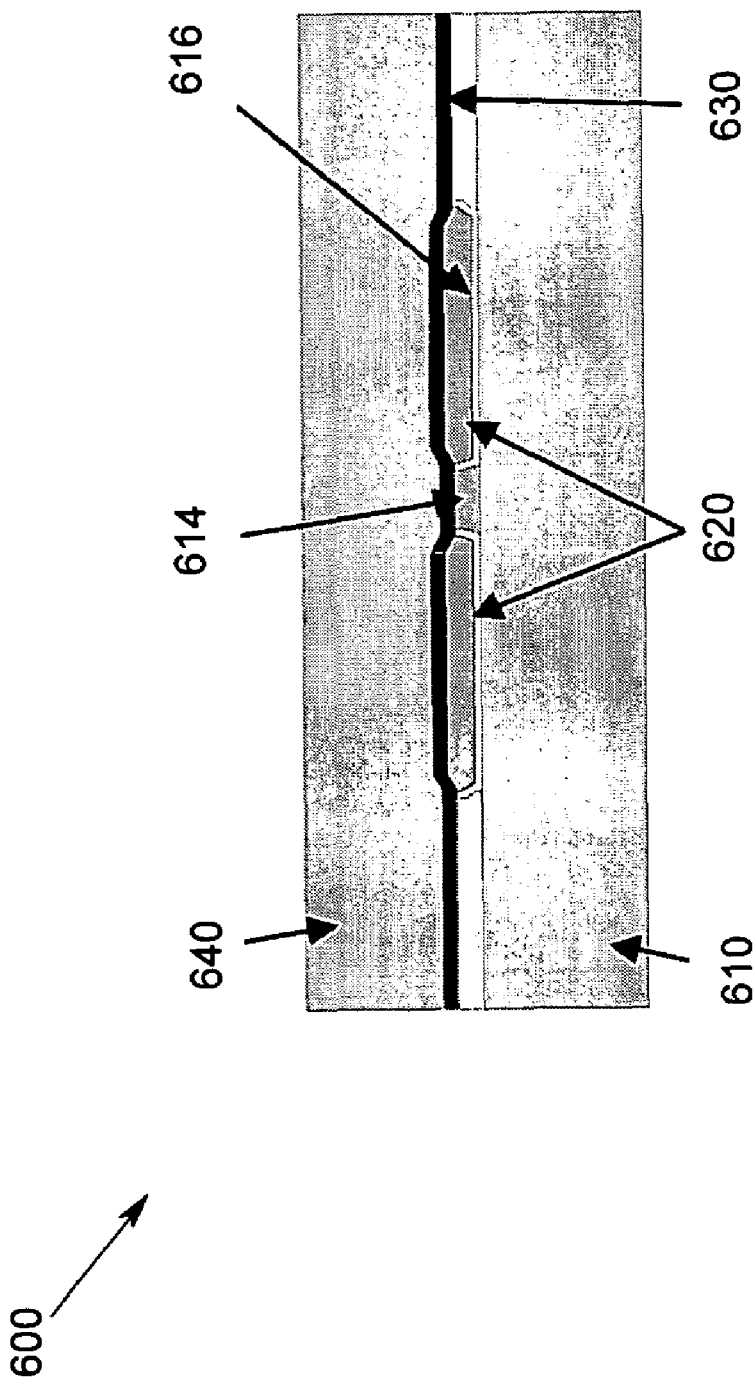
FIG. 6 is an illustration of a tunneling magnetoresistance (TMR) head.

FIG. 6 is an illustration of a tunneling magnetoresistance (TMR) head 600. The tunneling magnetoresistance (TMR) head 600 is shown with first and second hard magnet layers 620 disposed at first and second side edges of the sensor 614. The first and second hard magnet layers 620 stabilizes and sets the magnetization direction of the free layer in the sensor 614. The sensor 614 is formed over a first lead/shield layer 610. A primary gap 616 is provided between the first and second hard magnet layers 620 and the first lead/shield layer 610. A non-magnetic spacer layer 630 is formed over the first and second hard magnet layers 620 and primary gap material 616. A second lead/shield layer 640 is formed over the non-magnetic spacer layer 630. The sense current is conducted perpendicular to the films of the sensor, and thus is referred to as a current perpendicular to the plane (CPP) type of sensor.

Figure 7:
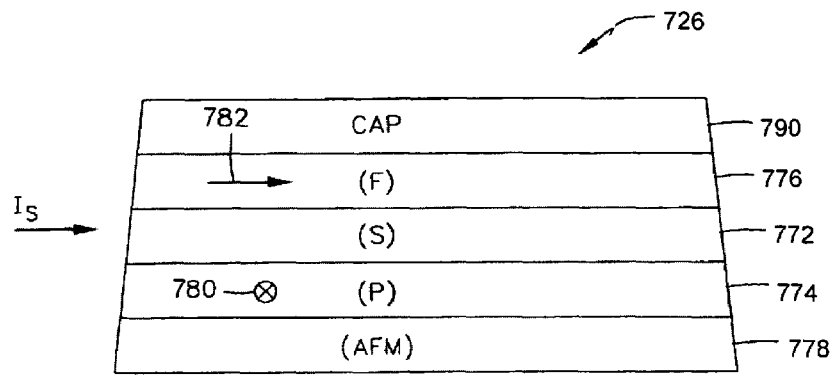
FIG. 7 is an ABS illustration of a typical spin valve sensor.

FIG. 7 is an ABS illustration of the spin valve sensor 726 that is exemplary of spin valve sensors existing in the art. The spin valve sensor 726 includes a nonmagnetic conducting spacer layer (S) 772 that is located between a ferromagnetic pinned layer (P) 774 and a ferromagnetic free layer (F) 776. The pinned layer 774 is exchange coupled to an antiferromagnetic (AFM) pinning layer 778 which pins a magnetic moment 780 of the pinned layer perpendicular to the ABS, such as into the read head, as shown in FIG. 7. The free layer 776 has a magnetic moment 782 that is parallel to the ABS and may be directed from left to right, as shown in FIG. 7. A cap layer 790 is located on the free layer 76 for protecting it from subsequent processing steps. When signal fields rotate the magnetic moment 782 of the free layer, this changes the resistance of the spin valve sensor to the sense current which, in turn, causes a change in potential which is processed as a playback signal by a processing circuit (not shown).

Figure 8:
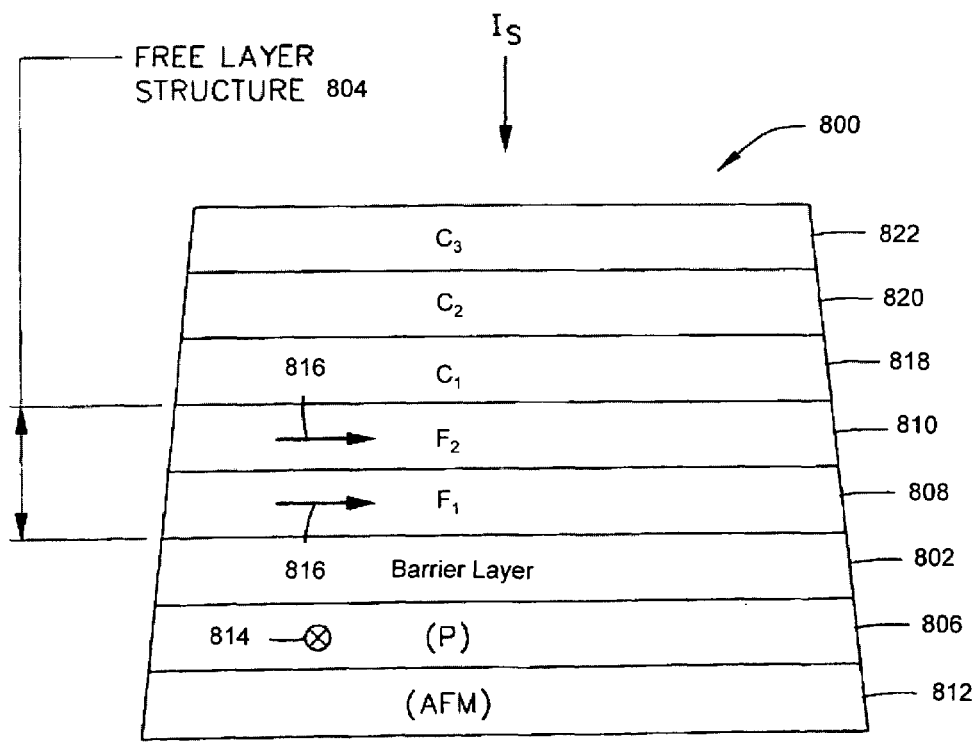
FIG. 8 is an ABS illustration of a typical tunnel valve sensor.

FIG. 8 illustrates a typical tunnel junction read sensor 800. Tunnel junction read sensor 800 includes a nonmagnetic insulative tunneling or barrier layer 802 that is located between a free layer 804 and a pinned layer (P) 806. The free layer 804 may include first and second films 808 and 810. The pinned layer 806 is exchange coupled to an antiferromagnetic layer (AFM) 812 which pins a magnetic moment 814 of the pinned layer perpendicular to the ABS, such as into the read head, as shown in FIG. 8. The free layer 804 has a magnetic moment 816 which is oriented parallel to the ABS and may be directed from left to right, as shown in FIG. 8. Located on top of the film 810 are capping layers 818, 820 and 822. When a signal field rotates the magnetic moment 816, resistance changes are processed as playback signals by processing circuitry.

Figure 9:
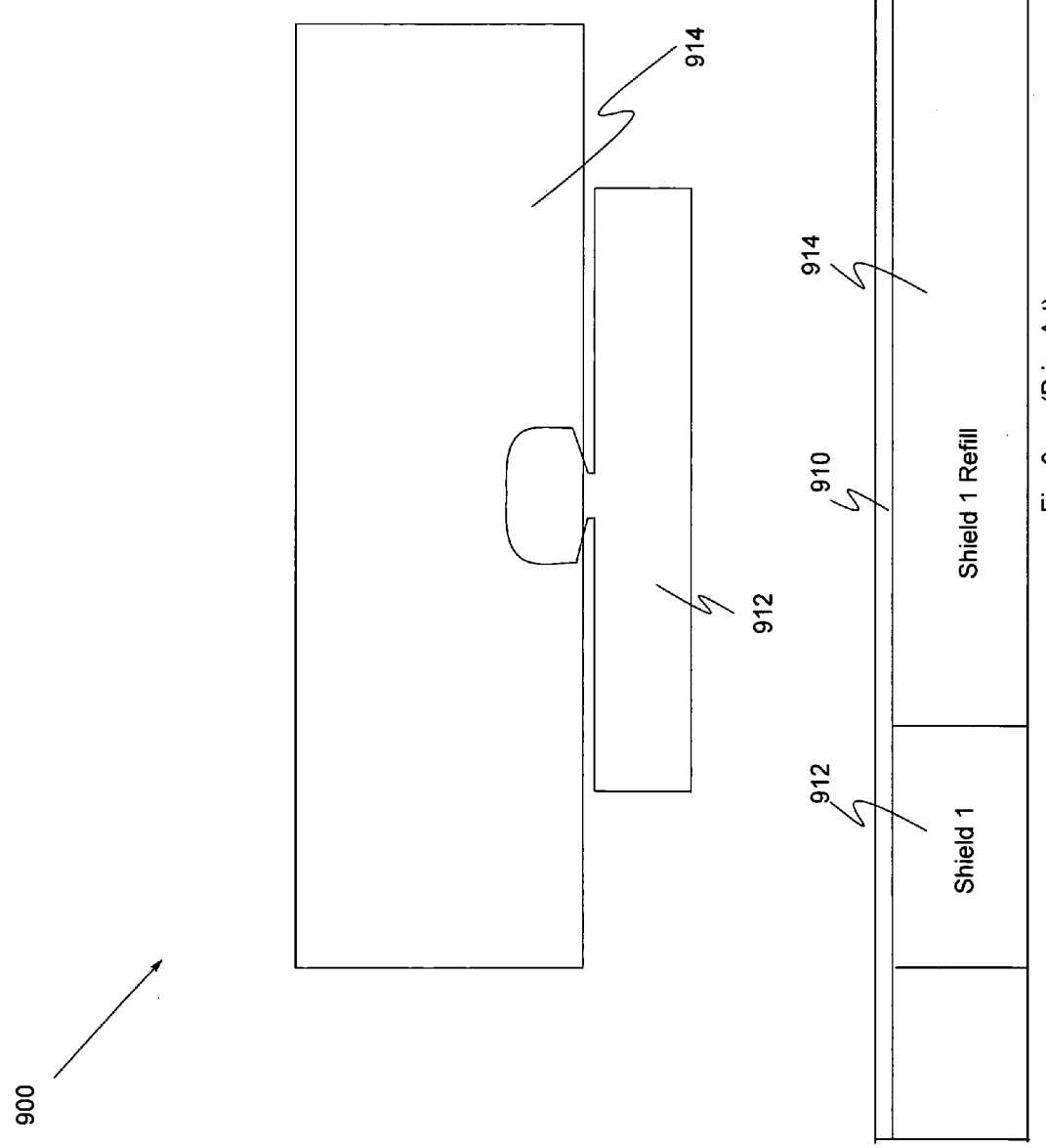
FIGS. 9-14 shows a conventional partial mill process that uses two separate photolithography steps.

FIGS. 9-14 shows a conventional partial mill process that uses two separate photolithography steps. FIG. 9 shows the sensor is 910 deposited full film over shield 1 912 and the shield 1 refill 914. In forming the shield 1912 and the shield 1 refill 914, the shield 912 may be plated, coated with alumina 914 and then chemical-mechanical polished (CMP).

Figure 10:
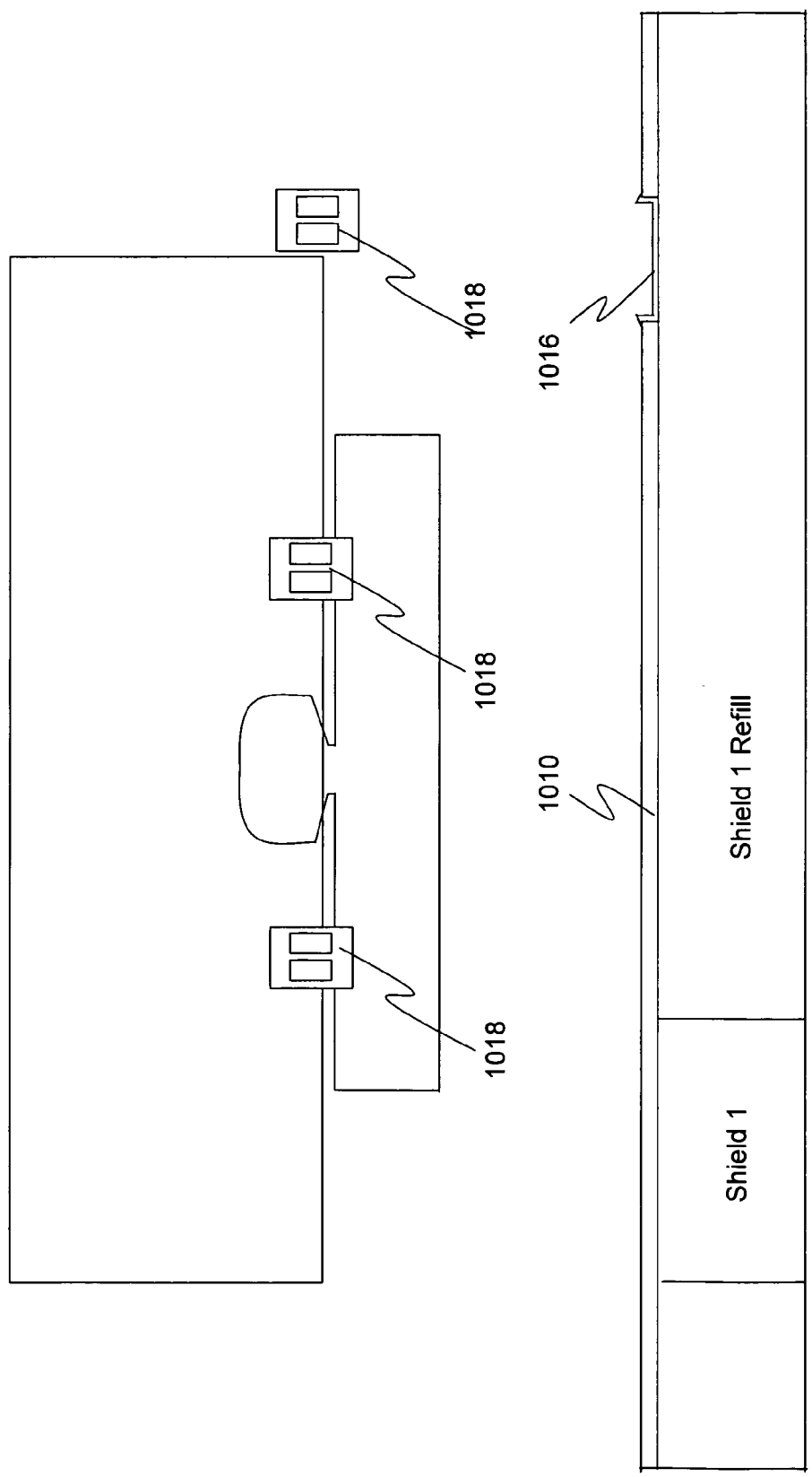

In FIG. 10, a portion of the sensor film 1010 for the electronic lapping guide is milled and replaced with a predetermined electronic lapping guide material 1016. Electronic lapping guide leads 1018 are deposited.

Figure 11:
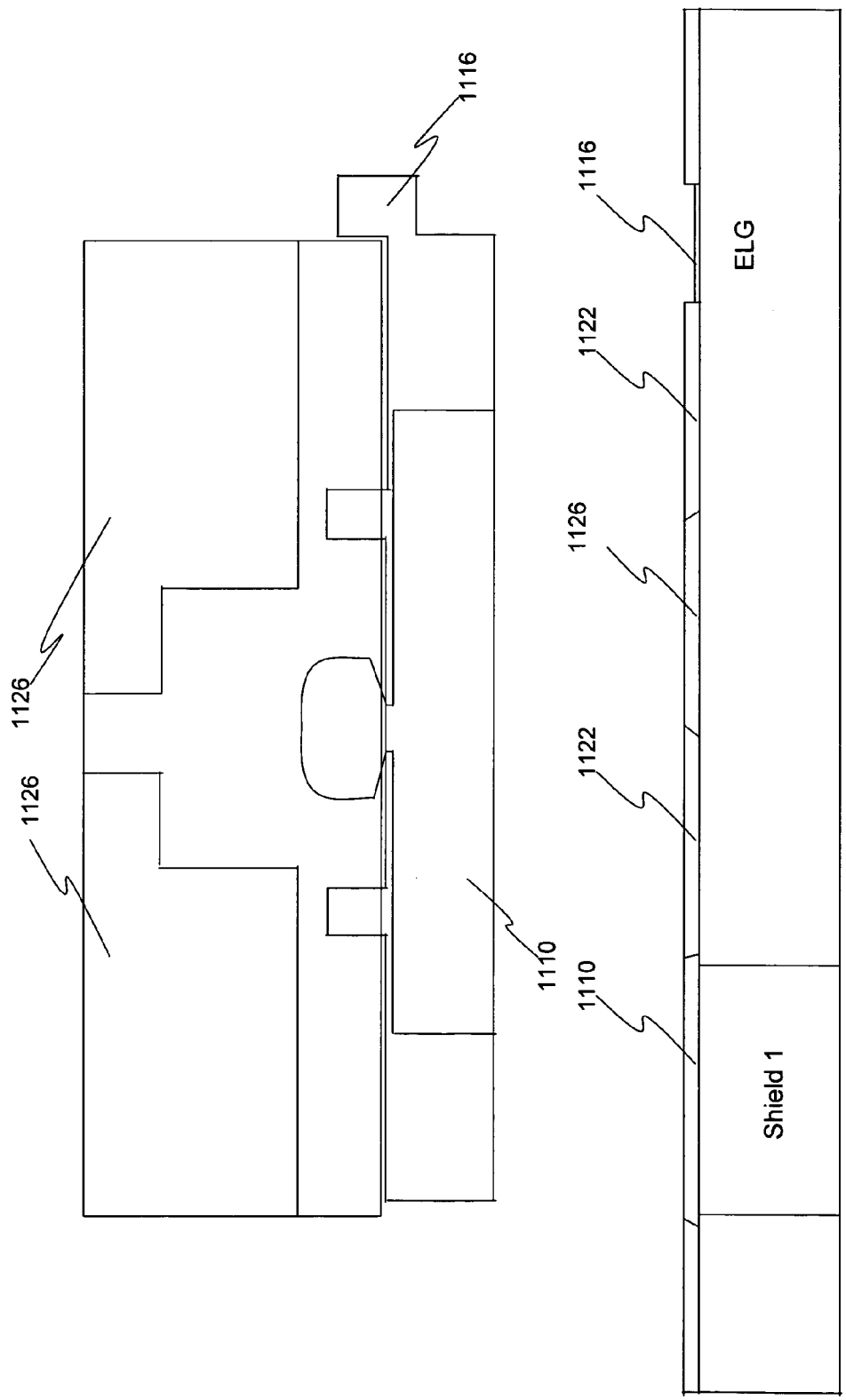

FIG. 11 shows the sensor film 1110 in the field is milled and replaced with alumina 1122. The sensor film 1110 is then defined with a partial mill simultaneously with the electronic lapping guide 1116. The photoresist protects preserved regions of the image structure 1126 for subsequent steps. The photoresist also protects areas of element 1110 and the electronic lapping guide 1116. Then, the field is cleared of sensor material 1110 and refilled with alumina 1122 to planarize.

Figure 12:
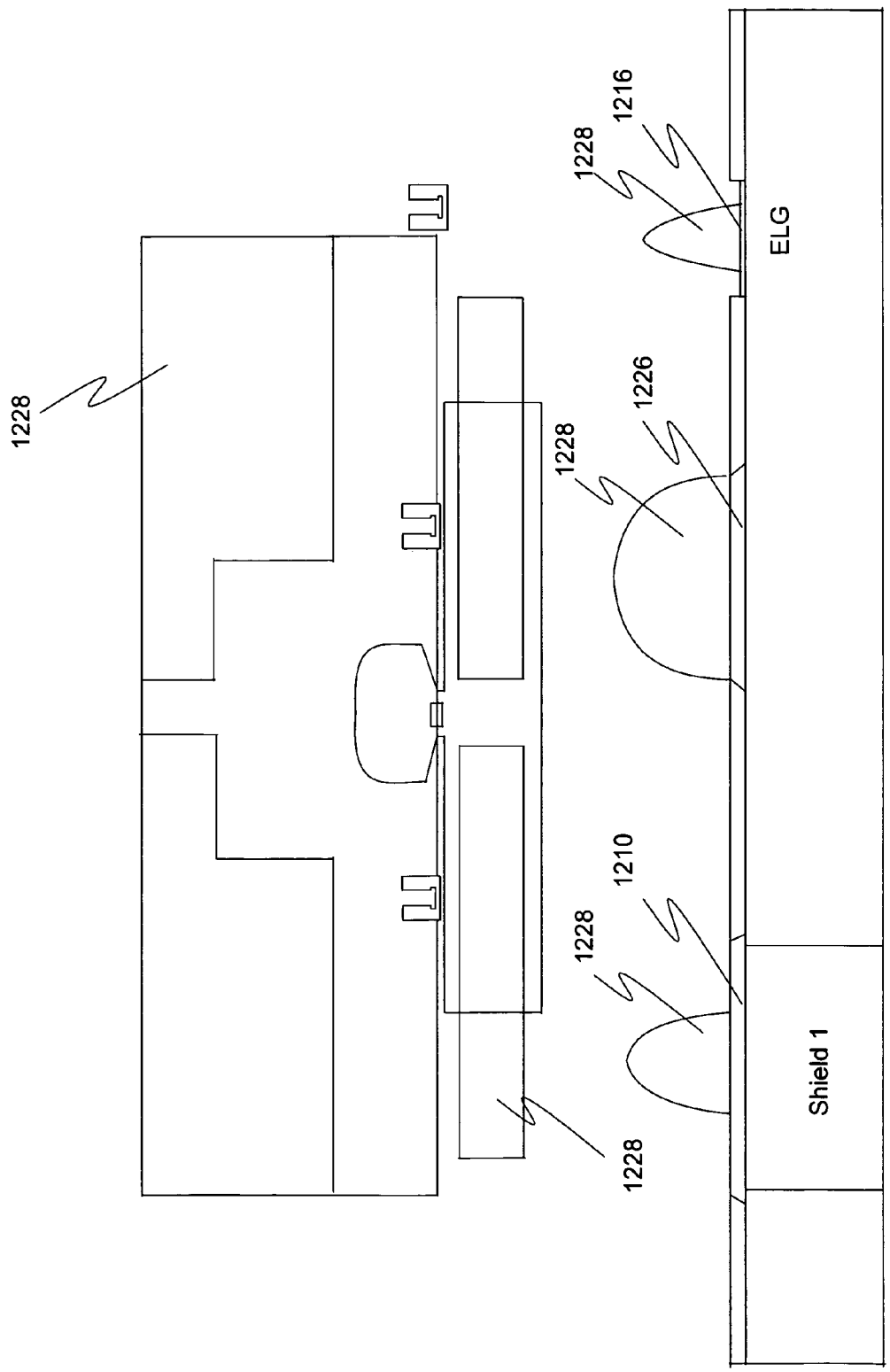

FIG. 12 shows photoresist 1228 for the critical partial mill step over a portion of the element 1210, image structure 1226 and the electronic lapping guide 1216. The photoresist over the electronic lapping guide 1216 is located below the plane of the sensor 1210.

Figure 13:
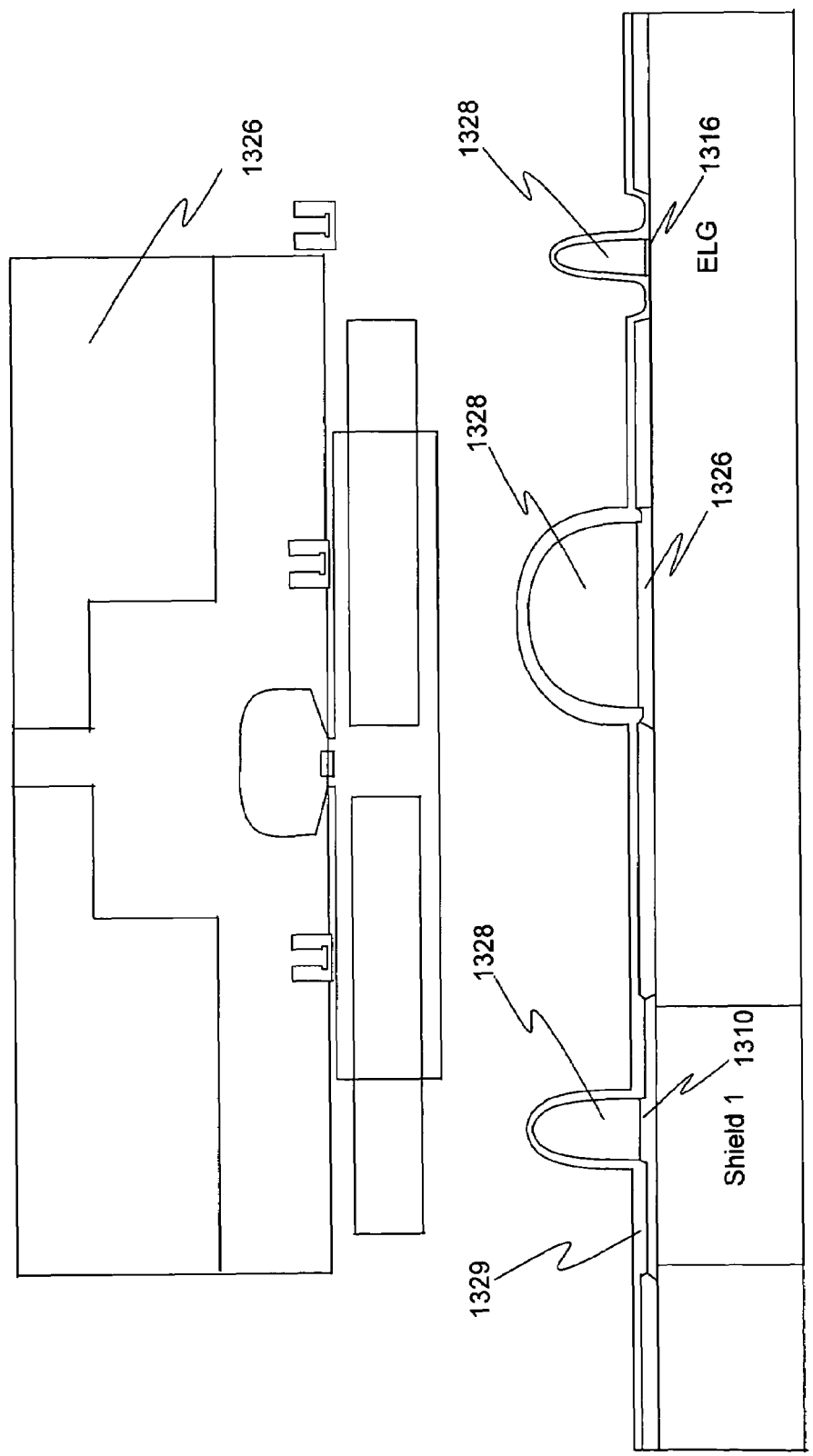

FIG. 13 shows the result of a partial mill of the sensor 1310 image structure 1326 and electronic lapping guide 1316 masked by the photoresist 1328. After the partial mill, the milled area is then refilled with a refill material 1329, e.g., alumina, to planarize and insulate. The electronic lapping guide 1316 remains unplanarized.

Figure 14:
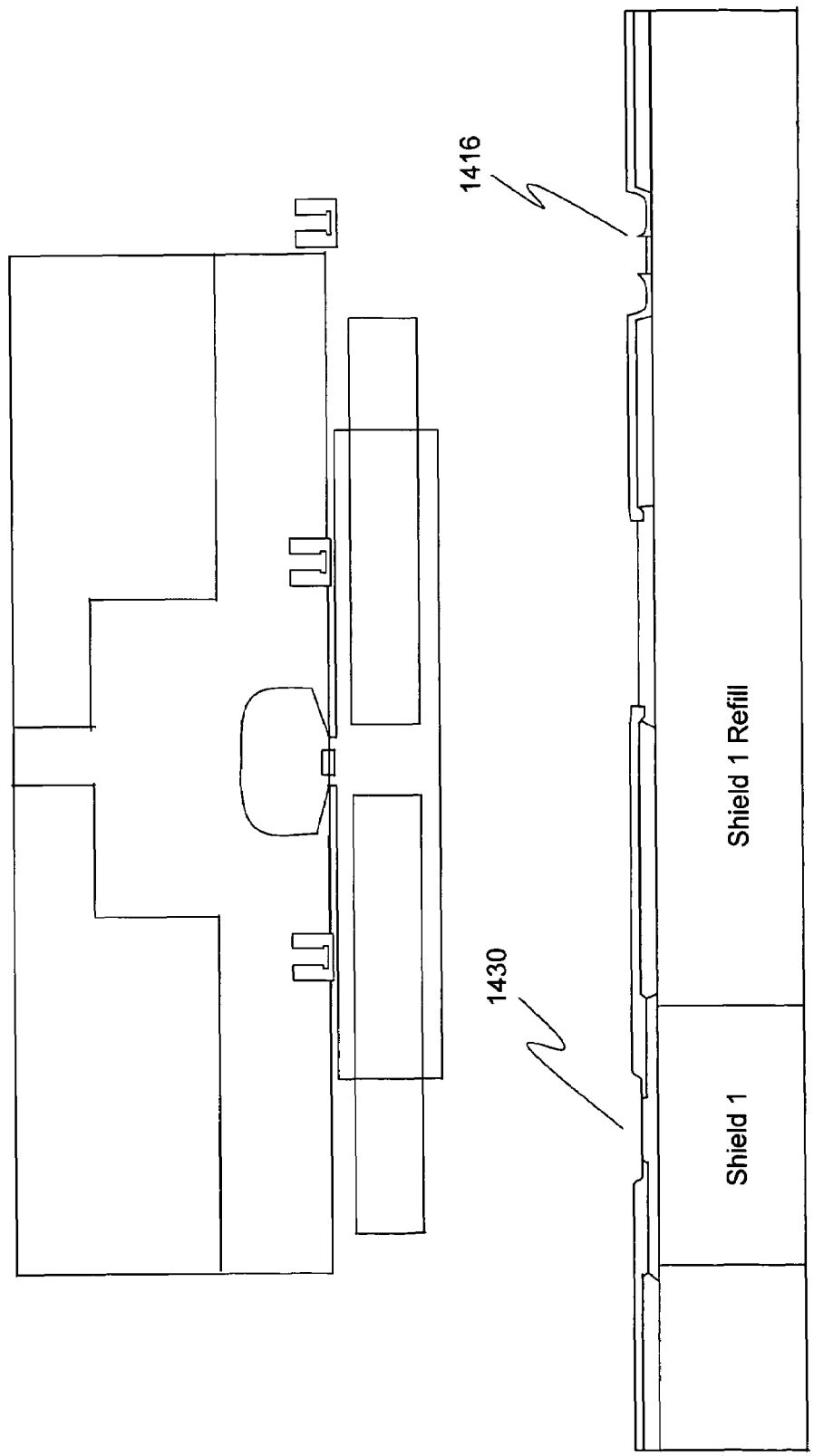

FIG. 14 shows the removal of the photoresist 1328 shown in FIG. 13. The photoresist 1328 may be removed via CMP to planarize the surface 1430 except for the electronic lapping guide 1416.

However, the process described above with reference to FIGS. 9-14 does not result in a planar surface. In addition, the number of manufacturing steps should be reduced to minimize the cycle time and cost of manufacturing. In addition, the above process results in the electronic lapping guide not being in the same focal plane as the element, thereby making the electronic lapping guide edge to sensor-edge sensitive to variations in focus.

Figure 15:
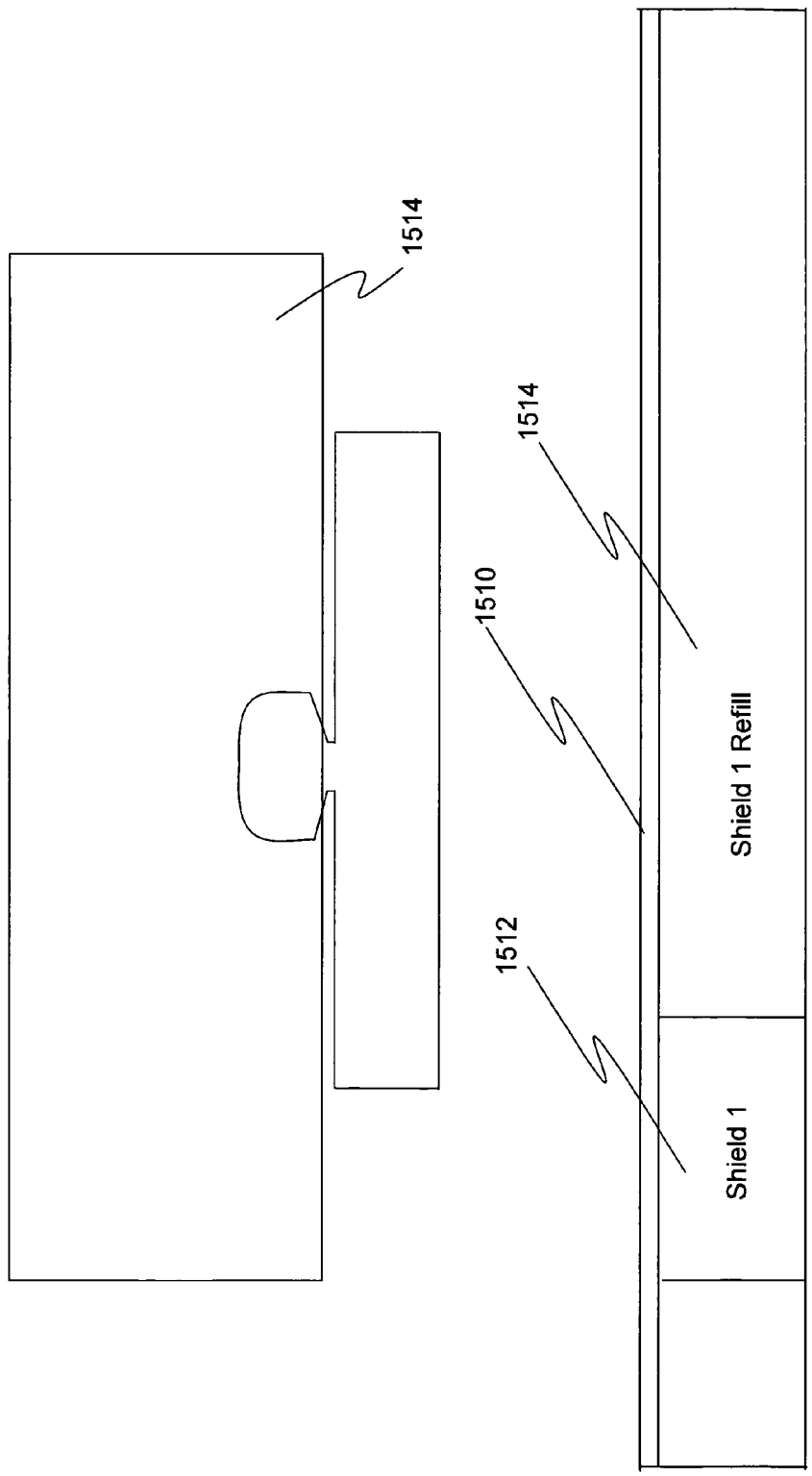
FIGS. 15-19 shows a partial mill process that does not utilize a prefill according to an embodiment of the present invention.

FIGS. 15-19 shows a partial mill process that does not utilize a prefill according to an embodiment of the present invention. FIG. 15 shows the sensor is 1510 deposited full film over shield 1 1512 and the shield 1 refill 1514. In forming the shield 1 1512 and the shield 1 refill 1514, the shield 1512 may be plated, coated with alumina 1514 and then chemical-mechanical polished (CMP).

Figure 16:
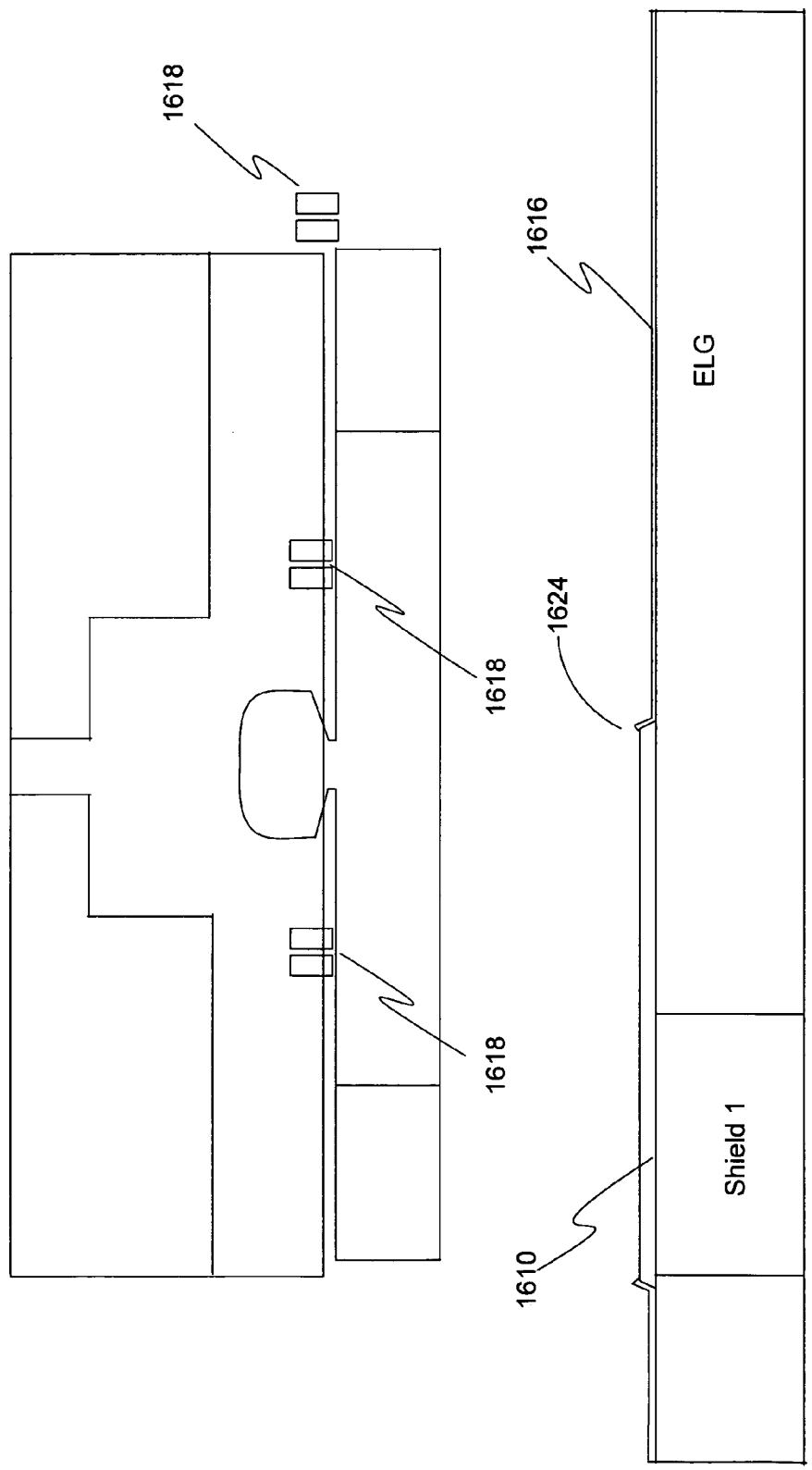

In FIG. 16, the Sensor film at the point of the electronic lapping guide and in the field is milled and replaced with electronic lapping guide material 1616. Electronic lapping guide leads 1618 are deposited. The back edge 1624 of the strip is defined with a partial mill simultaneously with the back edge of the electronic lapping guide 1616. The field is completely milled because it has electronic lapping guide material 1616 at this stage instead of sensor.

Figure 17:
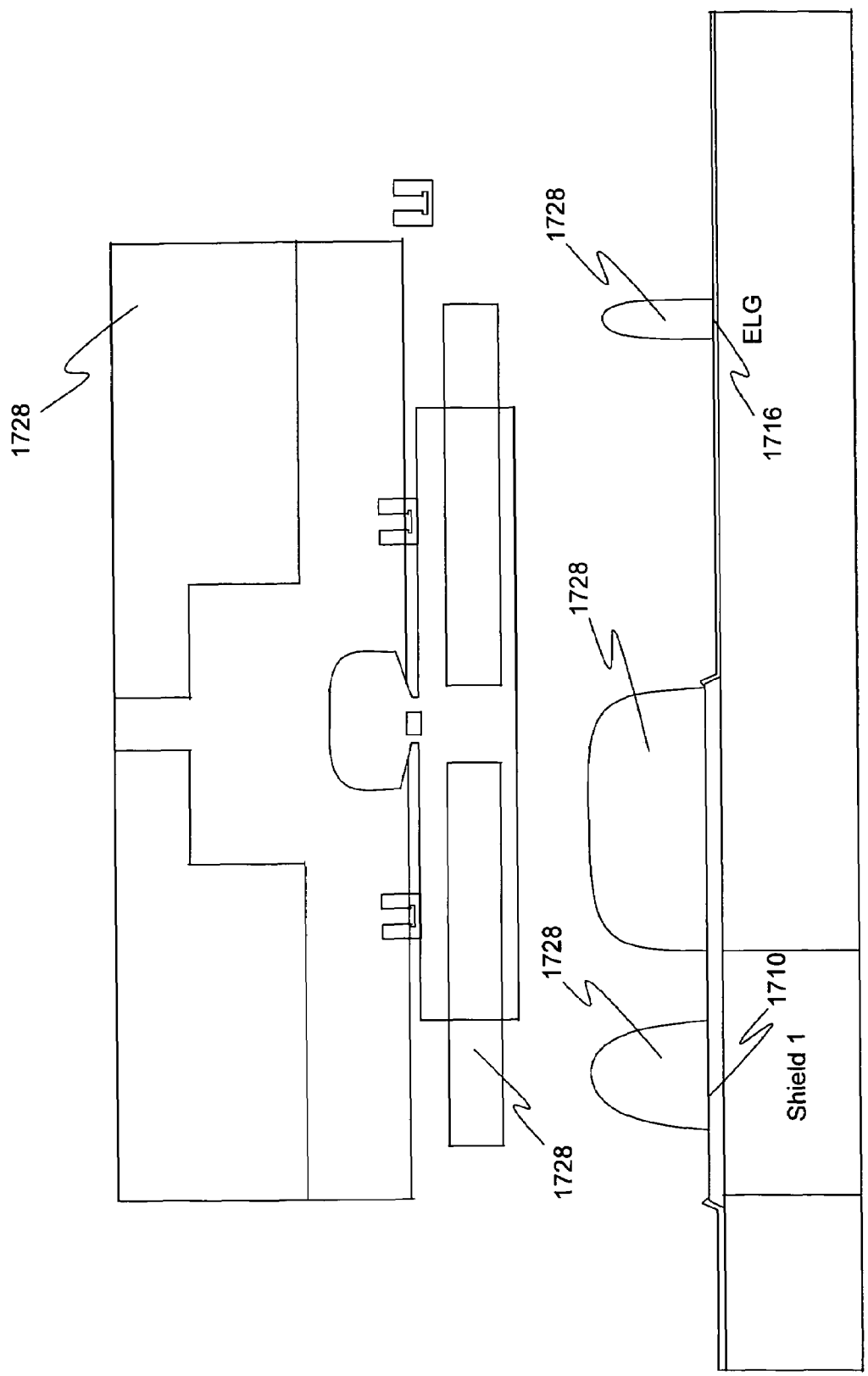

In FIG. 17, photoresist 1728 is deposited to protect the element 1710 and electronic lapping guide 1716. The electronic lapping guide 1716 is located below the plane of the element 1710.

Figure 18:
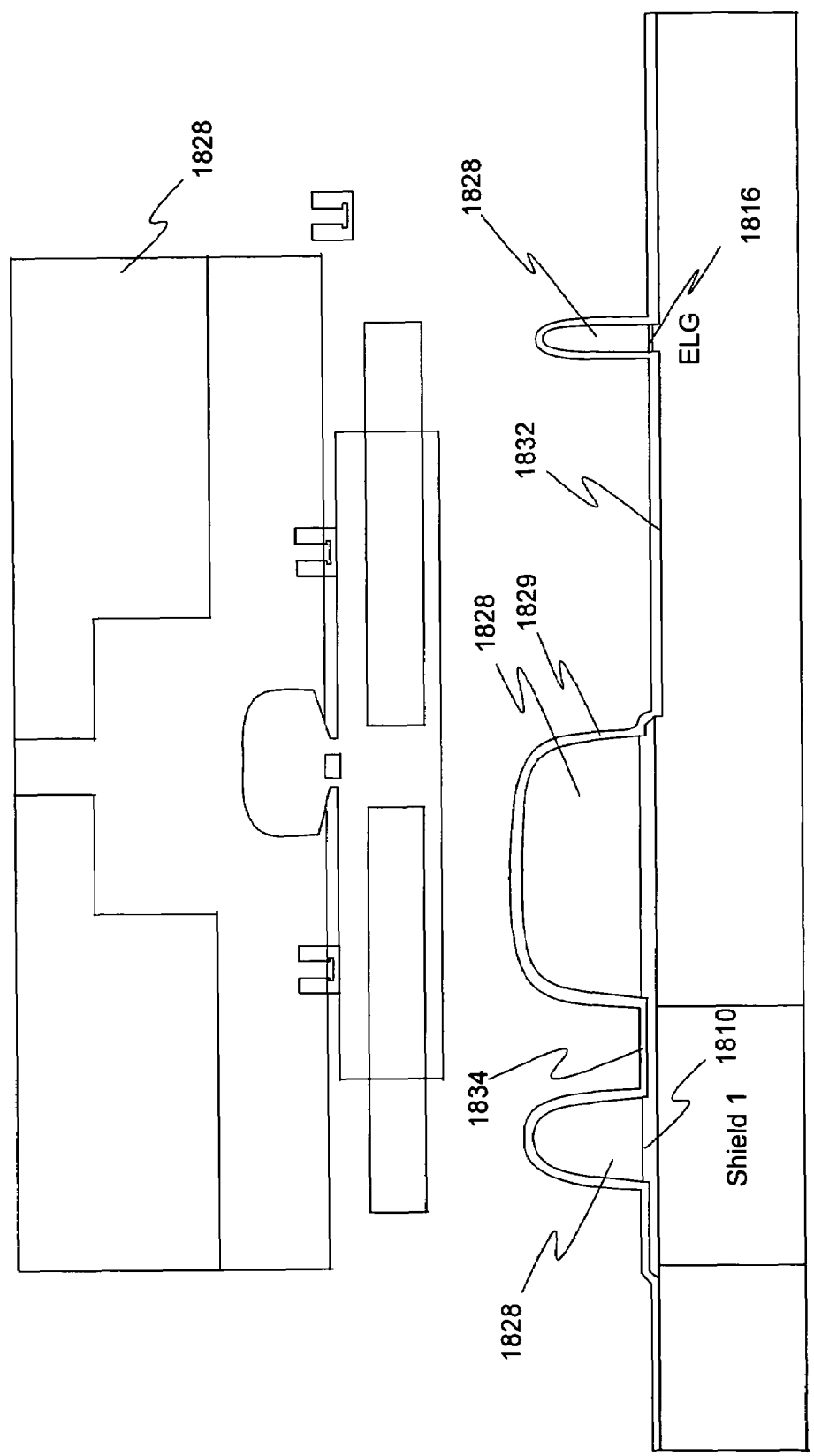

In FIG. 18, the element 1810 and electronic lapping guide 1816 are defined by a milling process using photoresist 1828. The milled area is then refilled with a refill material 1829 to planarize. The area proximate the electronic lapping guide 1816 and approximately half of the field 1832 is lower than the remaining field area 1834

Figure 19:
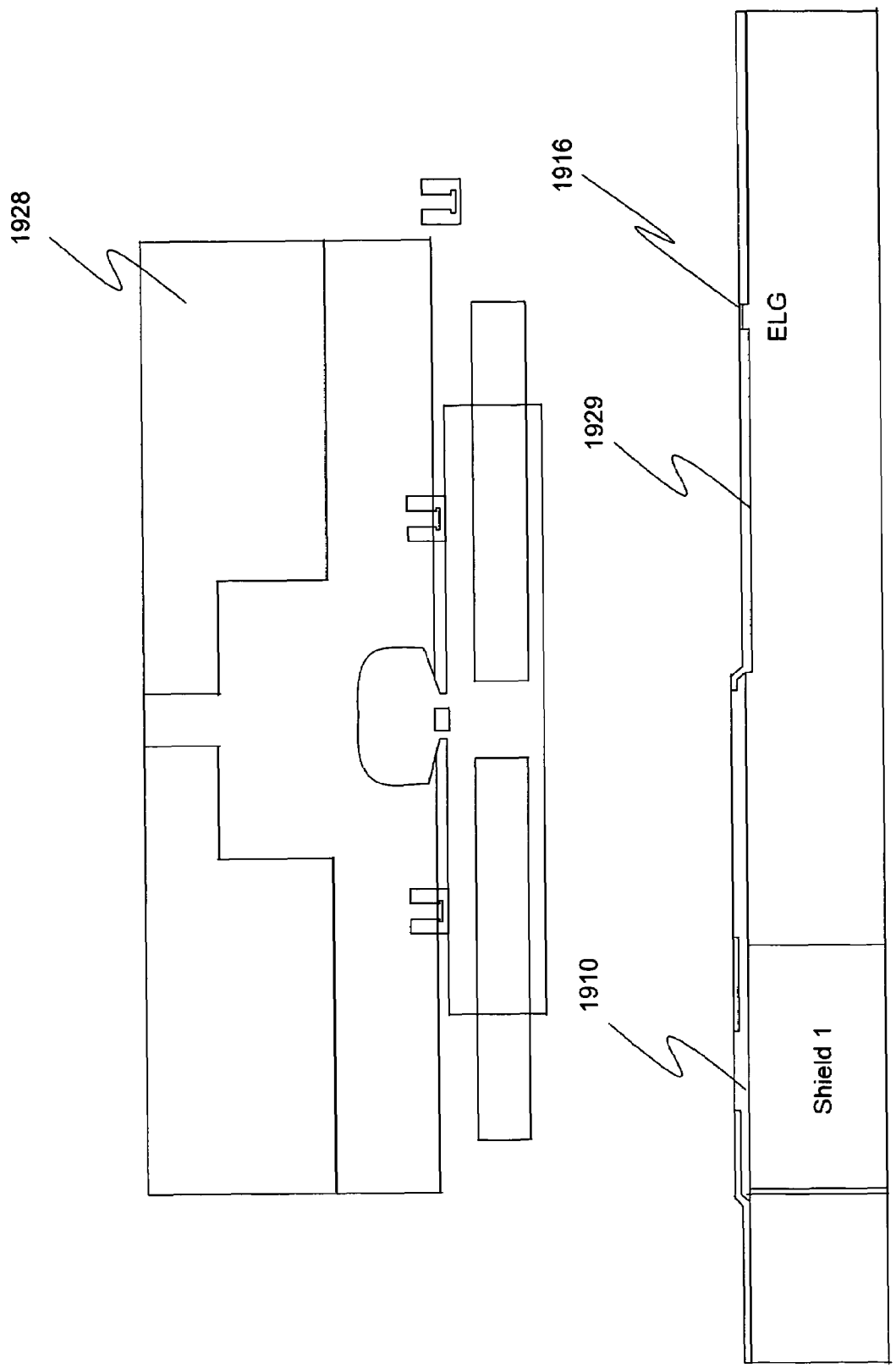

FIG. 19 shows the element 1910 and electronic lapping guide 1916 with the overlaid photoresist 1928. The refill material 1929 is shown providing a surface co-planar with the electronic lapping guide 1916. In FIG. 19, the photoresist 1828 of FIG. 18 is removed. The photoresist 1828 may be removed through planarization, e.g., CMP. The resulting surface is not left planar.

The process described above with respect to FIGS. 15-19 improves cycle time relative to the current process by eliminating some of the steps, e.g., the photoresist application, exposure and development, sensor milling, sputter deposition of alumina, wrinkle bake of photo resist and alumina liftoff and strip of photo resist shown in FIG. 11.

However, the process shown in FIGS. 15-19 does not have a prefill, its planarization is incomplete and is probably not applicable to wafer builds that employ CMP assisted liftoff.

Figure 20:
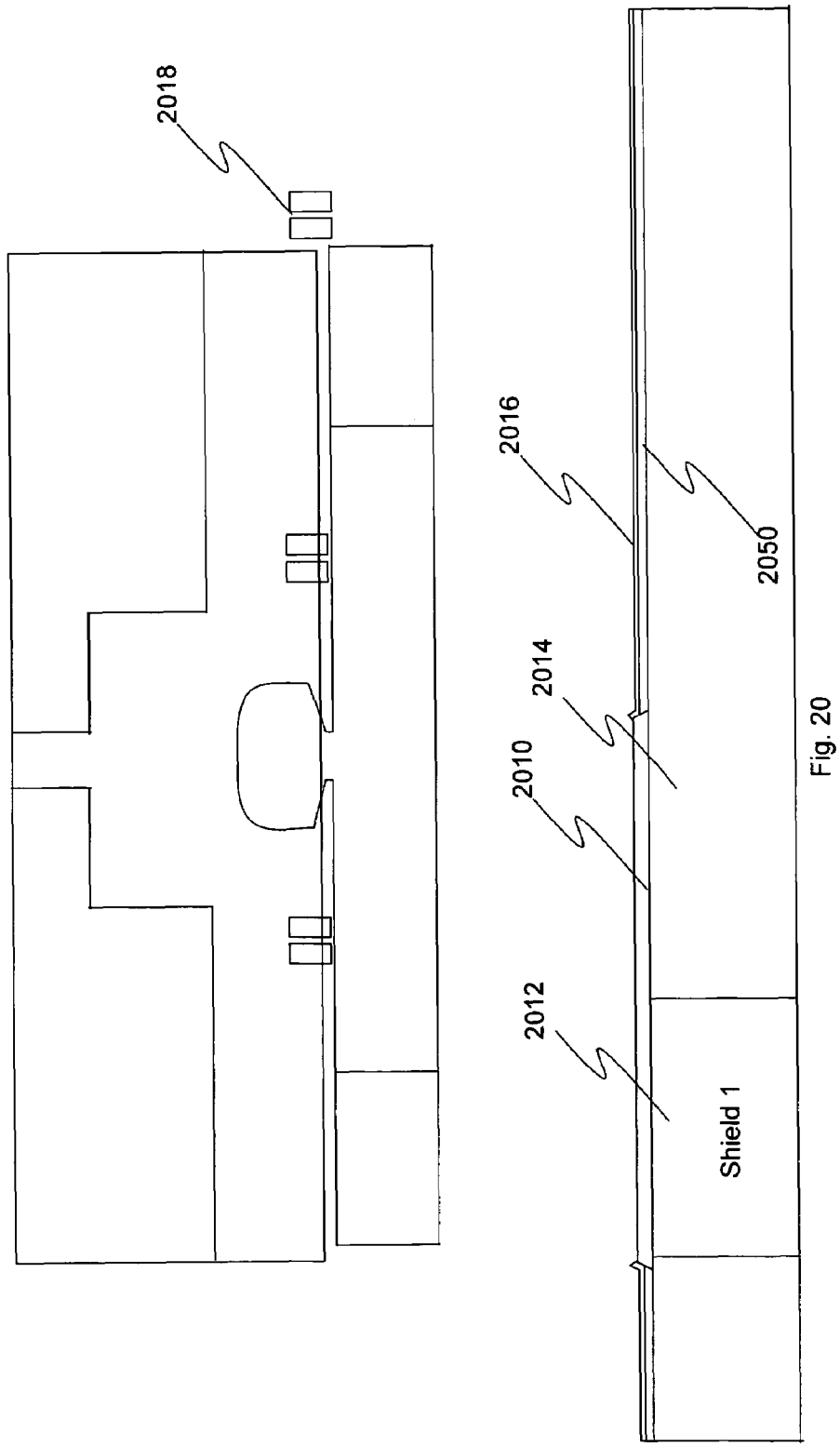
FIGS. 20-23 shows a partial mill process that uses a prefill step according to an embodiment of the present invention.

FIGS. 20-23 shows a partial mill process that uses a prefill step according to an embodiment of the present invention. In FIG. 20, the sensor is 2010 deposited full film over shield 1 2012 and the refill 2014. In forming the shield 1 2012 the shield 2012 may be plated, coated with alumina 2014 and then chemical-mechanical polished (CMP). The sensor film 2010 is milled and first refilled with prefill alumina 2050 and then the electronic lapping guide material 2016 is deposited planar with the sensor 2010. Electronic lapping guide leads 2018 are deposited.

Figure 21:
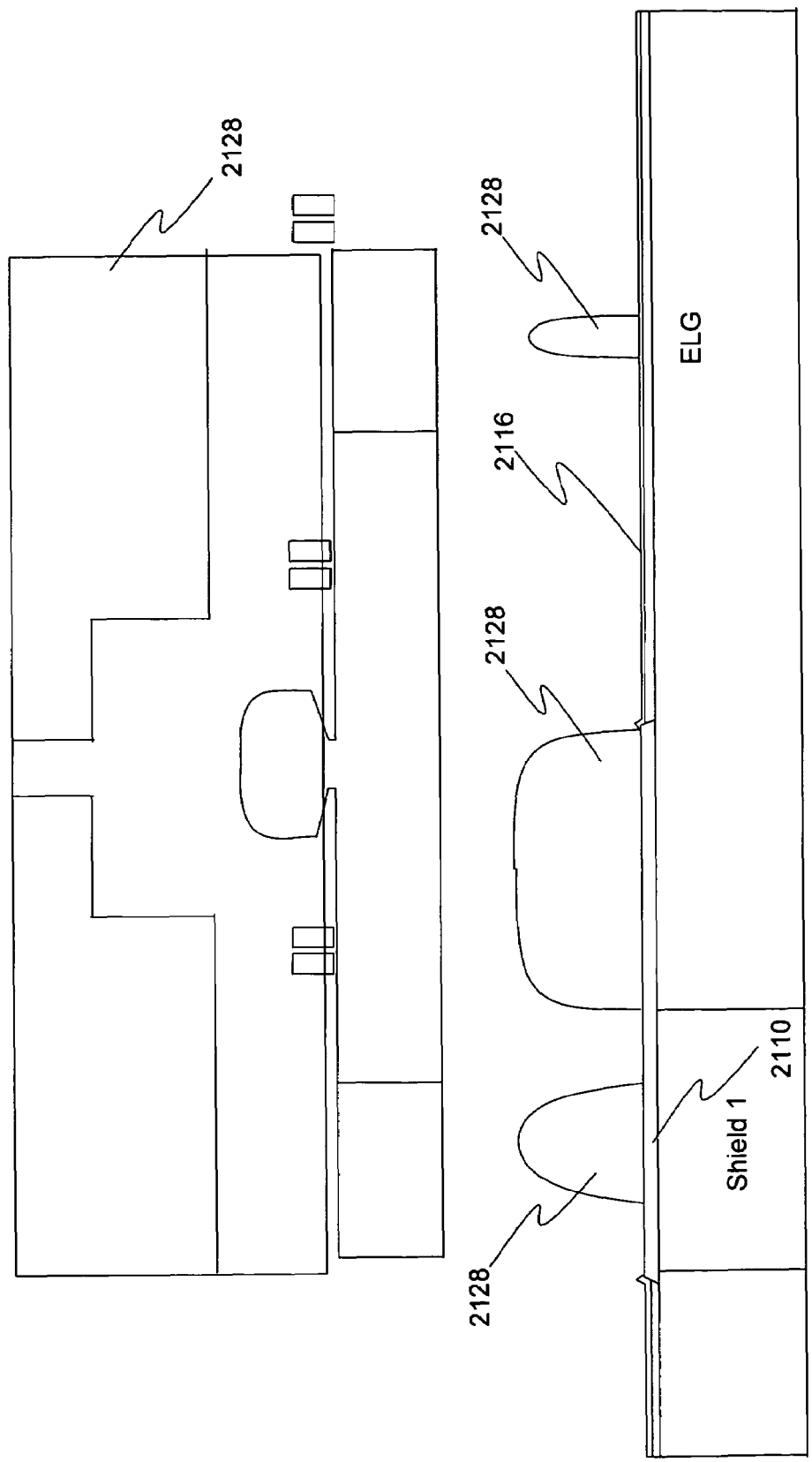
Figure 22:
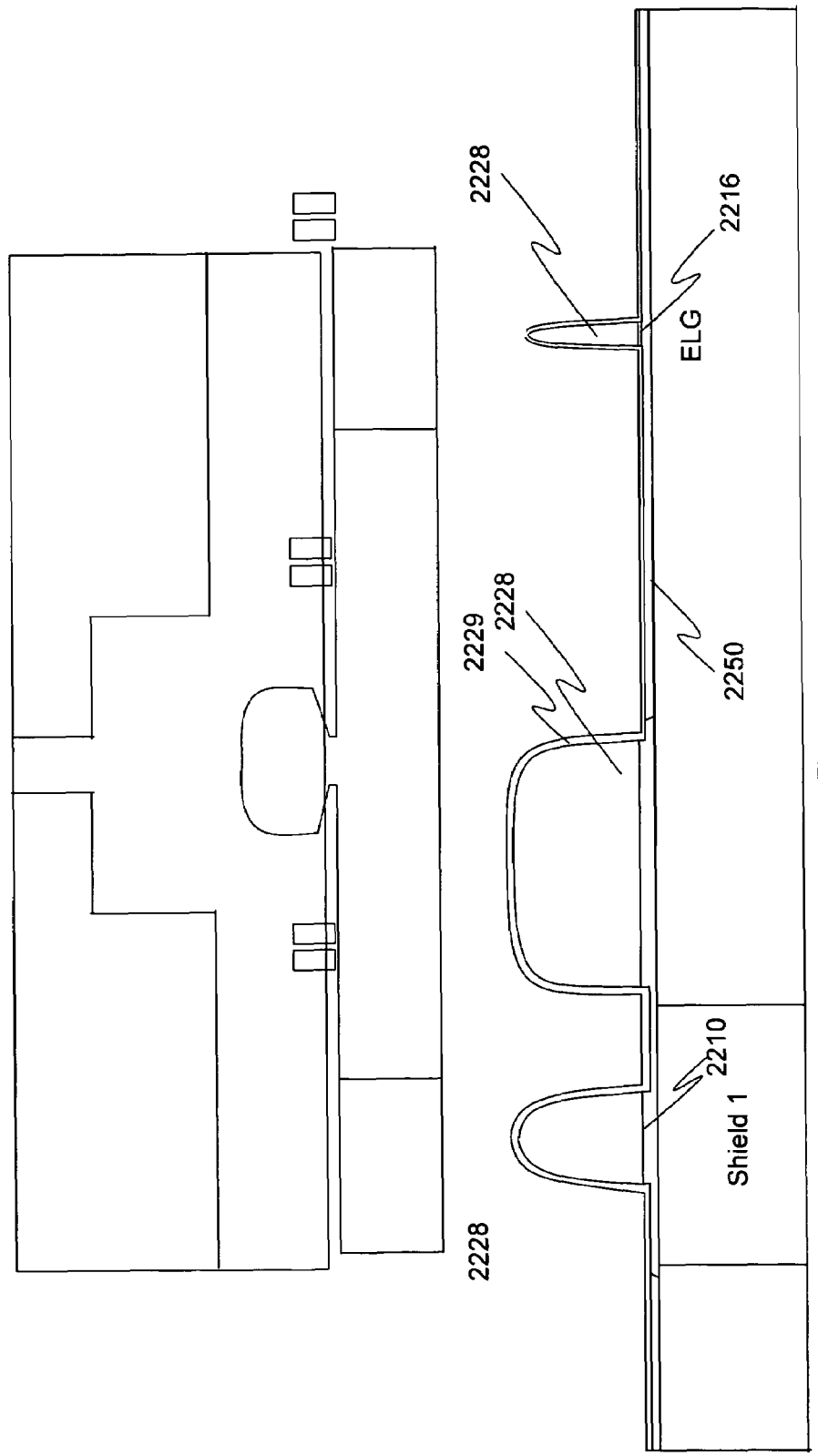

In FIG. 21, a photoresist 2128 is formed over the element 2110 and the electronic lapping guide 2116. In FIG. 22, the element 2210 and the electronic lapping guide 2216 are defined by milling. The back edge of the strip is defined with a partial mill simultaneously with the back edge of the electronic lapping guide 2216 by partially removing the prefill material 2250. All metal in the field is completely milled because it has electronic lapping guide material 2216 at this stage instead of sensor material 2210. The milled area is then refilled with a refill material 2229 to planarize the structure. The refill material 2229 is deposited over the photoresist 2228. The electronic lapping guide 2216 and the field including the top surface of the sensor material 2210 are at the same plane thus making CMP efficient.

Figure 23:
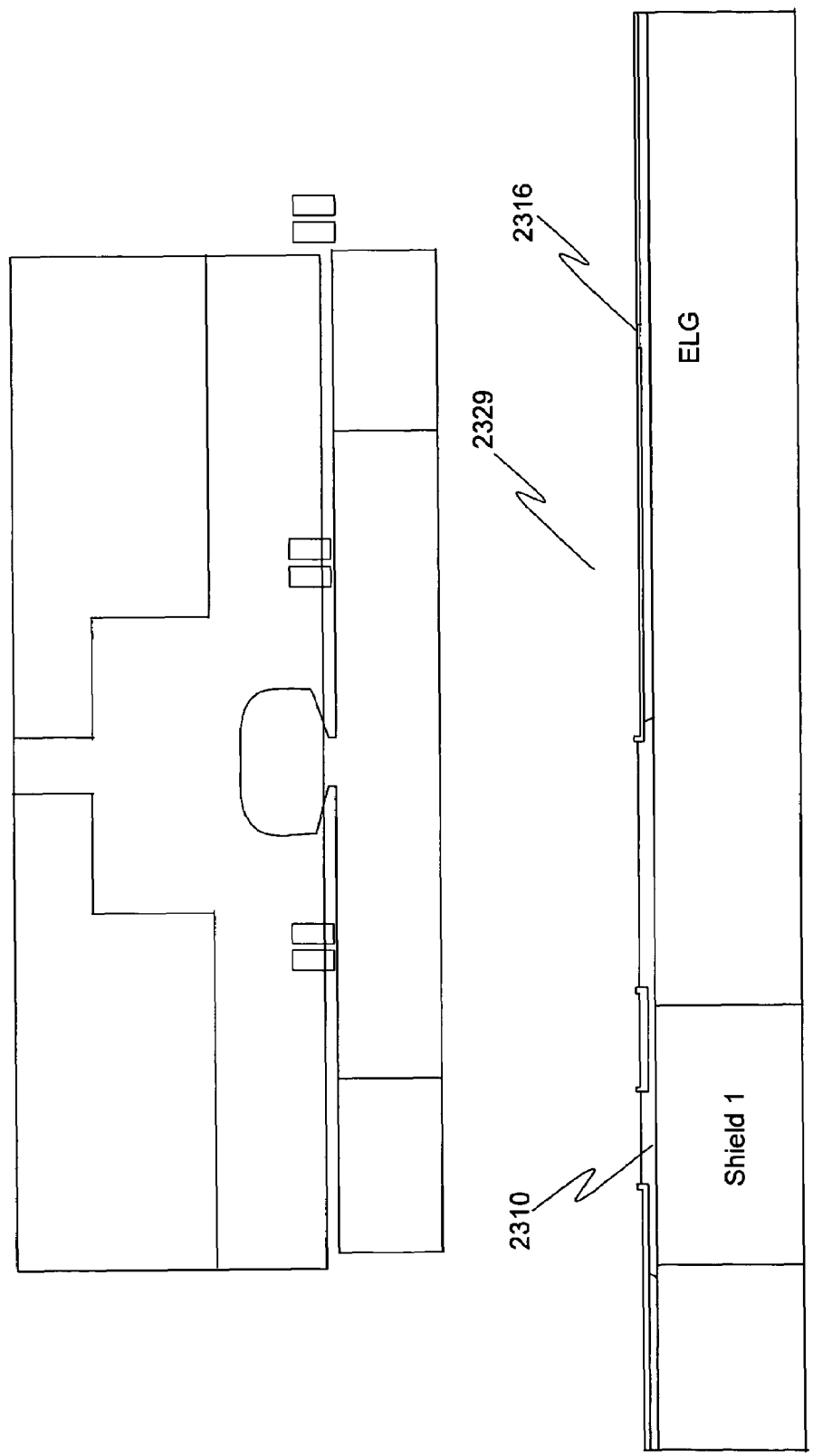

In FIG. 23, the photoresist 2228 of FIG. 22 is shown removed. The photoresist 2228 may be removed through planarization, e.g., CMP. After planarization via, for example, CMP, the surface is fully planar, i.e., the element 2310 the refill material 2329 and the electronic lapping guide 2316 are planar.

The process described above with reference to FIGS. 20-23 improves cycle time relative to current process by eliminating some of the steps, e.g., the photoresist application, exposure and development, sensor milling, sputter deposition of alumina, wrinkle bake of photo resist and alumina liftoff and strip of photo resist shown in FIG. 11. Since the process described above with reference to FIGS. 20-23 does have a prefill, the alumina deposition is not removed. However, this deposition can now be done in the same pump-down as the back edge of the electronic lapping guide 2316 effectively eliminating the cycle time of the step. It's planarization raises the electronic lapping guide 2316 region up to the height of the sensor 2310 allowing the sensor 2310 and the back edge of the electronic lapping guide 2316 to be defined in the same focal plane of the optics.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A method for merging sensor field-mill and electronic lapping guide material placement for a partial mill process, comprising:

forming a full film sensor over a shield and shield refill material;

milling the sensor on a first side and a second side;

depositing sensor refill material on the first and second sides of the sensor; and depositing an electronic lapping guide material over the sensor refill material until the electronic lapping guide material is substantially coplanar with the sensor;

depositing photoresist over sensor material at a desired sensor location and over a the electronic lapping guide material at a desired electronic lapping guide material location to mask the desired sensor and electronic lapping guide material location;

partially milling the sensor and the electronic lapping guide material not masked by the photoresist to form an electronic lapping guide and sensor with predetermined dimensions;

depositing a mill refill material in the partially milled area and over the photoresist to planarize the sensor, the deposited refill material and the electronic lapping guide material; and removing the photoresist to expose the coplanar electronic lapping guide and the sensor.

2. The method of claim 1, wherein the forming a full film sensor over a shield and shield refill material further comprises plating a shield, coating the shield with alumina and chemical-mechanical polishing the plated shield and the alumina.

3. The method of claim 1 further comprising depositing leads for the electronic lapping guide.

4. The method of claim 1 further comprises defining a back edge of the sensor with a partial mill simultaneously with the back edge of the electronic lapping guide.

5. A method for merging sensor field-mill and electronic lapping guide material placement for a partial mill process, comprising:

forming a full film sensor over a shield and shield refill material;

milling the sensor on a first side and a second side;

depositing an electronic lapping guide material in the area milled on the first side and second side;

depositing photoresist over the sensor at a desired sensor location and the electronic lapping guide material at a desired electronic lapping guide material location to mask the desired sensor and electronic lapping guide material location;

milling the sensor and the electronic lapping guide material using the photoresist as a mask;

depositing a mill refill material until coplanar with the electronic lapping guide material in an area surrounding the electronic lapping guide material and until coplanar with the sensor in an area surrounding the sensor; and removing the photoresist to expose an electronic lapping guide below the plane of the sensor.

6. The method of claim 5, wherein the forming a full film sensor over a shield and shield refill material further comprises plating a shield, coating the shield with alumina chemical-mechanical polishing the plated shield and the alumina.

7. The method of claim 5 further comprising depositing leads for the electronic lapping guide.

8. The method of claim 5 further comprises defining a back edge of the sensor with a partial mill simultaneously with the back edge of the electronic lapping guide.

* * * * *